(12) United States Patent
Wu et al.

(10) Patent No.: US 7,087,931 B2
(45) Date of Patent: Aug. 8, 2006

(54) HIGH LUMINANCE INDIUM GALLIUM ALUMINUM NITRIDE LIGHT EMITTING DEVICE AND MANUFACTURE METHOD THEREOF

(75) Inventors: Jen-Chau Wu, Hsinchu (TW); Chung-Cheng Tu, Taipei (TW); Pao-i Huang, Chiayi (TW)

(73) Assignee: Epistar Corporation, Hsinchu (TW)

( * ) Notice: Subject to any disclaimer, the term of this patent is extended or adjusted under 35 U.S.C. 154(b) by 17 days.

(21) Appl. No.: 10/953,983

(22) Filed: Sep. 28, 2004

(65) Prior Publication Data

US 2005/0224832 A1 Oct. 13, 2005

(30) Foreign Application Priority Data

Apr. 13, 2004 (TW) ................ 93110243 A

(51) Int. Cl.
 *H01L 29/267* (2006.01)
(52) U.S. Cl. .............. 257/81; 257/79; 257/84; 257/96; 257/E25.032
(58) Field of Classification Search ................. None
 See application file for complete search history.

(56) References Cited

U.S. PATENT DOCUMENTS

| | | | |
|---|---|---|---|
| 5,925,897 A | 7/1999 | Oberman | 257/80 |
| 5,977,588 A | 11/1999 | Okazaki et al. | 257/99 |
| 6,078,064 A * | 6/2000 | Ming-Jiunn et al. | 257/103 |
| 6,252,894 B1 * | 6/2001 | Sasanuma et al. | 372/45.01 |
| 6,287,947 B1 | 9/2001 | Ludowise et al. | 438/606 |
| 6,465,808 B1 | 10/2002 | Lin | 257/81 |
| 6,479,836 B1 | 11/2002 | Suzuki et al. | 257/15 |

* cited by examiner

*Primary Examiner*—Nathan J. Flynn
*Assistant Examiner*—Scott R. Wilson
(74) *Attorney, Agent, or Firm*—Ingrassia Fisher & Lorenz

(57) ABSTRACT

A high luminance indium gallium aluminum nitride light emitting diode (LED) is disclosed, including a substrate, a first conductive type nitride layer, an active layer, a second conductive type nitride layer, a first contact layer, a second contact layer, and a conductive transparent layer. The first contact layer has a first bandgap and a first doping concentration, and is disposed on the second conductive type nitride layer. The second contact layer has a second bandgap and a second doping concentration, and is disposed on the first contact layer. The first doping concentration and the second doping concentration are respectively larger than a predetermined concentration, and the first bandgap is smaller than the second bandgap. The second contact layer is thinner than a predetermined thickness so that a tunneling effect occurs between the conductive transparent layer and the second contact layer while the LED is in operation.

18 Claims, 3 Drawing Sheets

HIGH LUMINANCE INDIUM GALLIUM ALUMINUM NITRIDE LIGHT EMITTING DEVICE AND MANUFACTURE METHOD THEREOF

CROSS REFERENCE TO RELATED APPLICATIONS

This application claims priority of Taiwan Patent Application Serial No. 93110243 entitled "High luminance indium gallium aluminum nitride light emitting device and manufacturing method thereof", filed on Apr. 13, 2004.

FIELD OF THE INVENTION

The present invention relates to a light emitting diode with high luminance. More particularly, the present invention relates to an indium gallium aluminum nitride LED with high luminance and low operation voltage, wherein high doping concentration is not required to obtain low operation voltage.

BACKGROUND OF THE INVENTION

Light emitting diodes (LEDs) are different from those conventional light sources in their unique structure and light emitting mechanism, and are more applicable to different industrial fields. For example, LEDs are characterized by their small size, high reliability, and high output, so they are suitable for various kinds of devices, such as indoor or outdoor large displays. Compared to conventional tungsten lamps, LEDs require no filament, consume less power, and respond more quickly, so they are widely used in communication devices or electronic devices. Some main developments of LEDs focus on enhancing the luminance and lowering energy consumption in order to increase competitiveness in the market.

Recently, conductive transparent layer (e.g. ITO, ZnO, etc) are widely used in various photoelectric device, such as TFT-LCD, OLED, and LED, in order to enhance luminance. However, in order to obtain a stable forward voltage while the LED is in operation, it is necessary to form an ohmic contact with the conductive transparent layer. This presents a major problem in the manufacturing of high luminance LEDs Indium tin oxide (ITO) was a well-known material in forming a conductive transparent layer. Oberman et al, U.S. Pat. No. 5,925,897, proposed a thin composed Au/Ni layer between ITO and the p-type InGaN contact layer. Lin et al, U.S. Pat. No. 6,465,808, proposed a dotted conductive transparent layer to increase light output as the dotted conductive transparent layer has less absorption area. Ludowise et al, U.S. Pat. No. 6,287,947, proposed a multi-layers conductive transparent layer between ITO and the p-type GaN contact layer. The above-mentioned inventions had the disadvantages of high forward voltage because of surface roughness effect during the epitaxy process and hydrogen passivation effect.

The following techniques applied an agent layer between the conductive transparent layer and the LED to lower the forward voltage. Okazaki et al, U.S. Pat. No. 5,977,566, proposed some metal agent layers (including Mg, Ni, Au, Zn, and Ti) to provide an omhic contact. Although the metal agent layer provided the omhic contact with the conductive transparent layer, the metal agent layer, which absorbed light, also decreased the light output. Jou et al, U.S. Pat. No. 6,078,064 proposed a p-type contact layer with high doping concentration (larger than $5*10^{18}$ cm$^{-3}$) as the agent layer, such as GaAs, AlGaAs, ot GaP. Suzuki et al, U.S. Pat. No. 6,479,836, proposed selectively doped super-lattice layers with high p-type carrier concentrations to lower the forward voltage, such as InGaN/GaN, AlGaN/GaN, and etc. Furthermore, the agent layer was provided by transforming Ni into NiO with the oxygen from ITO. Although the agent layer with high doping concentration provides the omhic contact with the conductive transparent layer, it also increases the carrier diffusion effect, and thus decreases the stability and reliability of the devices.

According to the fore-mentioned description, there exists a demand for a high luminance LED with good stability and reliability and operating at low forward voltage.

SUMMARY OF THE INVENTION

The present invention provides solutions to the problems in the LED manufacturing process of the prior art mentioned above.

It is one aspect of the present invention to provide a high luminance LED, which includes a contact layer with low doping concentration, and operates at a low and stable forward voltage.

It is another aspect of the present invention to provide a high luminance LED, wherein a tunneling effect occurs between the conductive transparent layer and a second contact layer during operation, and the thickness of the second contact layer is controlled to manipulate the forward voltage of the LED.

It is a further aspect of the present invention to provide a high luminance LED, wherein a material of Indium Gallium Aluminum Nitride is used as the contact layer.

The present invention discloses a high luminance light emitting diode (LED), including a substrate, a first conductive type nitride layer, an active layer, a second conductive type nitride layer, a first contact layer, a second contact layer, and a conductive transparent layer. The first conductive type nitride layer is disposed on the substrate as a cladding material. The active layer is disposed on the first conductive type nitride layer as a luminance material. The second conductive type nitride layer is disposed on the active layer as a cladding material. The first contact layer, which has a first bandgap and a first doping concentration, is disposed on the second conductive type nitride layer. The second contact layer, which has a second bandgap and a second doping concentration, is disposed on the first contact layer. The conductive transparent layer is disposed on the second contact layer.

The first doping concentration and the second doping concentration are respectively larger than a predetermined concentration, and the first bandgap is smaller than the second bandgap. The second contact layer is thinner than a predetermined thickness so that a tunneling effect occurs between the conductive transparent layer and the second contact layer while the LED is in operation. This LED structure provides a low operating voltage, and is able to be driven by a general power supply. The contact without high doping concentration could further depress the carrier diffusion effect and keep a stable forward voltage. In addition, the operation voltage is well controlled since the thickness of the second contact layer can be controlled during the epitaxy process. Therefore, the present invention can reduce the problems and complexities of the manufacturing process.

DETAILED DESCRIPTION OF THE INVENTION

Figure 1A:
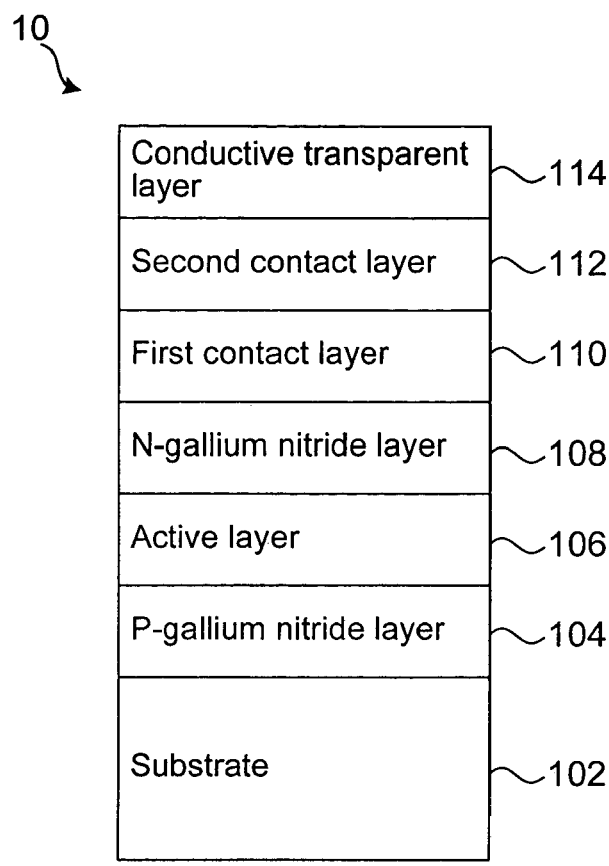
FIG. 1A is one embodiment of the high luminance LED in accordance with the present invention.
Figure 1B:
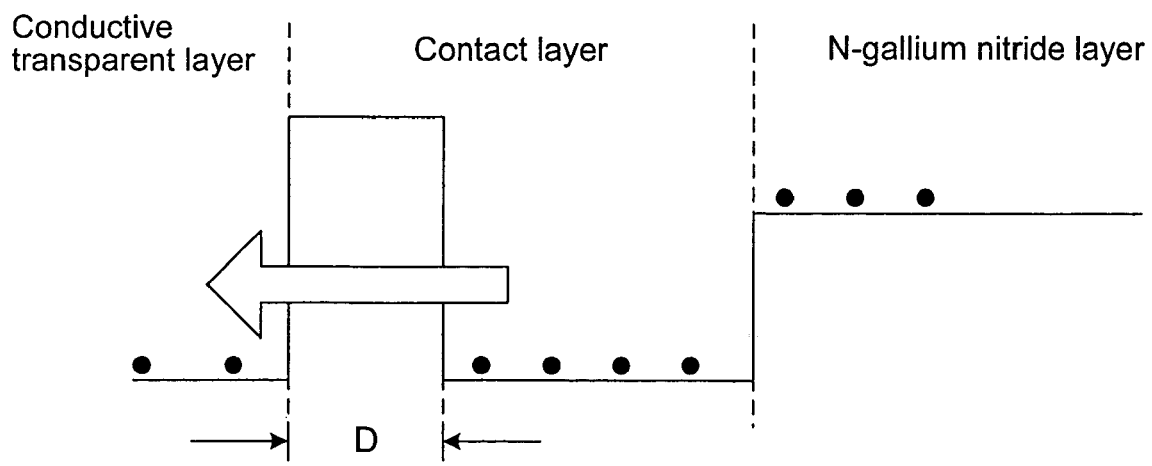
FIG. 1B is an energy level diagram of the LED shown in FIG. 1A.

FIG. 1A shows an embodiment of the high luminance LED 10 in accordance with the present invention. FIG. 1B shows an energy level diagram of the high luminance LED 10 illustrated in FIG. 1A. Referring to FIG. 1A, the high luminance LED 10 includes a substrate 102, a first conductive type nitride layer 104, an active layer 106, a second conductive type nitride layer 108, a first contact layer 110, a second contact layer 112, and a conductive transparent layer 114. The substrate 102 includes any well-known materials, such as silicon, silicon carbide, gallium arsenide, etc. The first conductive type nitride layer 104 is disposed on the substrate 102 as a cladding material, the active layer 106 is disposed on the first conductive type nitride layer 104 as a luminance material, and the second conductive type nitride layer 108 is disposed on the active layer 106 as a cladding material. The first conductive type nitride layer 104, the active layer 106 and the second conductive type nitride layer 108 include any well-known materials. In this embodiment, the first conductive type nitride layer 104 is a p-type gallium nitride layer, the second conductive type nitride layer 108 is an n-type gallium nitride layer, and the active layer 106 is an indium gallium nitride layer. The active layer 106 acts as a luminance layer in LED 10 in accordance with the present invention, and the fundamental and mechanism of light emitting are not elaborated here for conciseness since they are well known by those skilled in the art.

The first contact layer 110, disposed on the second conductive type nitride layer 108, has a first bandgap and a first doping concentration. The second contact layer 112, disposed on the first contact layer 110, has a second bandgap and a second doping concentration. The conductive transparent layer 114 is disposed on the second contact layer 112. The conductive transparent layer 114 includes any well-known materials, such as indium tin oxide, zinc oxide, indium oxide, zirconium oxide, and etc. The first contact layer 110 and the second contact layer 112 include indium gallium aluminum nitride, which has a composition of $In_xGa_yAl_zN$, wherein $x+y+z=1$ and $0 \leq x,y,z \leq 1$. The first bandgap of the first contact layer 110 is smaller than the second bandgap of the second contact layer 112. The first doping concentration and the second doping concentration are respectively larger than a predetermined concentration, which is $5*10^{16} cm^{-3}$ in this embodiment. The thickness of the second contact layer 112 is at most 20 angstroms. In this embodiment, the first contact layer 110 and the second contact layer 112 are p-type doped. Due to the structures and characteristics mentioned above, a tunneling effect occurs between the conductive transparent layer 114 and the second contact layer 112 while the LED 10 is in operation.

In order to form an ohmic contact, the prior technique uses a contact layer with a low bandgap and a high doping concentration. The low bandgap requirement limits the flexibility in selecting the contact layer materials. For example, Indium is more or less used in the contact layer to meet the low bandgap requirement in the prior art's technique. However, Indium also decreases the transparency of the contact layer. The present invention provides an improved structure. Refer to FIG. 1B to have a better understanding of the operation mechanism of the high luminance LED in accordance with the present invention. The only bandgap limitation of the present invention requires the bandgap of the first contact layer to be smaller than the bandgap of the second contact layer. Therefore, the present invention offers flexibility and advantages in choosing the materials of the contact layer. For example, the composition of the contact layer is $In_xGa_yAl_zN$ ($x+y+z=1$ and $0 \leq x,y,z \leq 1$), and the contact layer of the present invention can use materials that do not contain indium (i.e. when x equals zero), which provide better transparency of the LED. Moreover, high doping concentration (larger than $5*10^{18} cm^{-3}$) is required to form the ohmic contact in the prior art techniques. However, high doping concentration also comes with some side effects. First, increasing the doping concentration also increases the diffusion effect, and the undesired ion diffusion reduces the stability and reliability of the component. Second, increasing the doping concentration also increases light absorption, and thus decreases the light emitting efficiency. Moreover, high doping concentration has several other drawbacks, such as oxidation, passivation, etc. The present invention can form the ohmic contact with a lower doping concentration (larger than $5*10^{16} cm^{-3}$), and therefore provides a better solution compared to the prior art techniques.

The prior art techniques control the operating voltage by high doping concentration whereas the present invention provides an operating voltage controlling method, which is easily performed during the manufacturing process. The present invention can keep the operating voltage of the LED 10 in an appropriate range by controlling the thickness of the second contact layer 112 within a predetermined thickness, i.e. the tunneling thickness D (shown in FIG. 1B) during the tunnel effect. Typically, the tunneling effect occurs when the thickness of the second contact layer 112 is smaller than 20 angstroms. Therefore, the electrons directly pass through the second contact layer 112 by the tunneling effect without overcoming the energy gap of the second contact layer 112. The thickness of the second contact layer 112 can be well controlled by the epitaxial process, which provides better operating voltage control than the doping concentration process. Therefore, the present invention provides a more stable and reliable high luminance LED. It should be noted that the thickness of the first contact layer 110 does not affect the operating voltage of the LED 10.

Figure 2A:
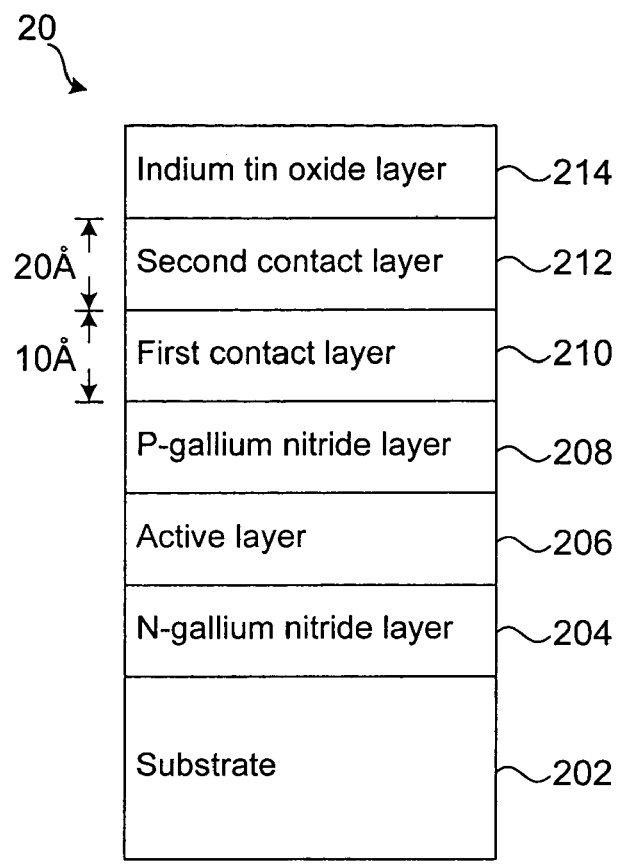
FIG. 2A is another embodiment of the high luminance LED in accordance with the present invention.
Figure 2B:
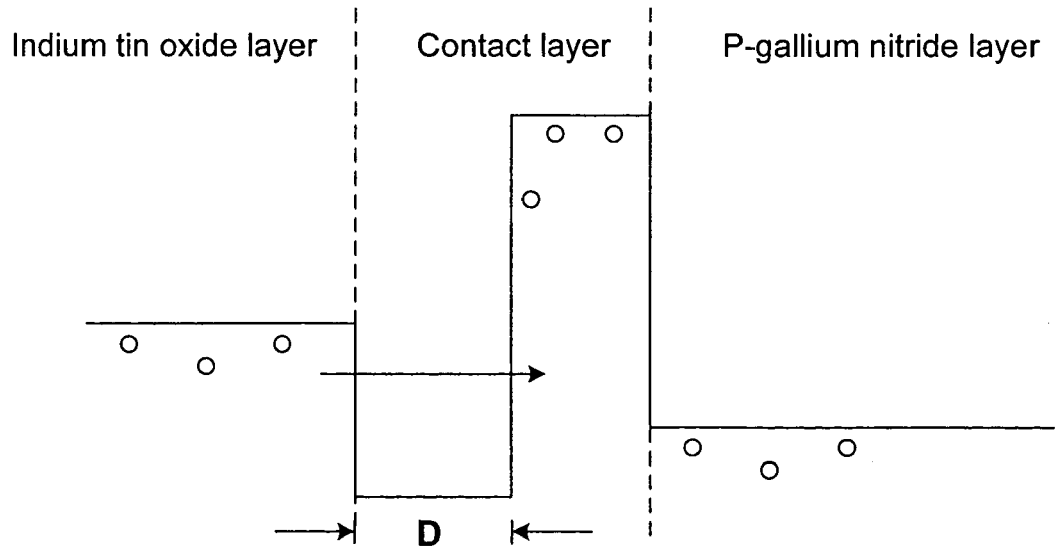
FIG. 2B is an energy level diagram of the LED shown in FIG. 2A.

FIG. 2A is another embodiment of the high luminance LED in accordance with the present invention. FIG. 2B is an energy level diagram of the LED shown in FIG. 2A. Referring to FIG. 2A, the high luminance LED 20 includes a substrate 202, an N-type gallium nitride layer 204, an active layer 206, a P-type gallium nitride layer 208, a first contact layer 210, a second contact layer 212, and an indium tin oxide layer 214. The first contact layer 210 has a first bandgap and a first doping concentration. The second contact layer 212 has a second bandgap and a second doping concentration. The first contact layer 210 and the second contact layer 212 include indium gallium aluminum nitride, which has a composition of $In_xGa_yAl_zN$, wherein $x+y+z=1$ and $0 \leq x,y,z \leq 1$. The first bandgap of the first contact layer 210 is smaller than the second bandgap of the second contact layer 212. The first doping concentration and the second doping concentration are respectively larger than a predetermined concentration, which is $5*10^{16} cm^{-3}$ in this embodiment. The first contact layer 210 has a thickness of 10 angstroms. The second contact layer 212 has a thickness of 20 angstroms. The present invention can keep the operating voltage of the LED 20 in an appropriate range by controlling the thickness of the second contact layer 212 within a predetermined thickness, i.e. the tunneling thickness D (shown in FIG. 2B) during the tunnel effect. Therefore, the electron holes directly pass through the second contact layer 212 by the tunneling effect without overcoming the energy gap of the second contact layer 212. It should be noted that other characteristics and advantages of this embodiment are similar to the previous description and are not elaborated here for conciseness.

Figure 3:
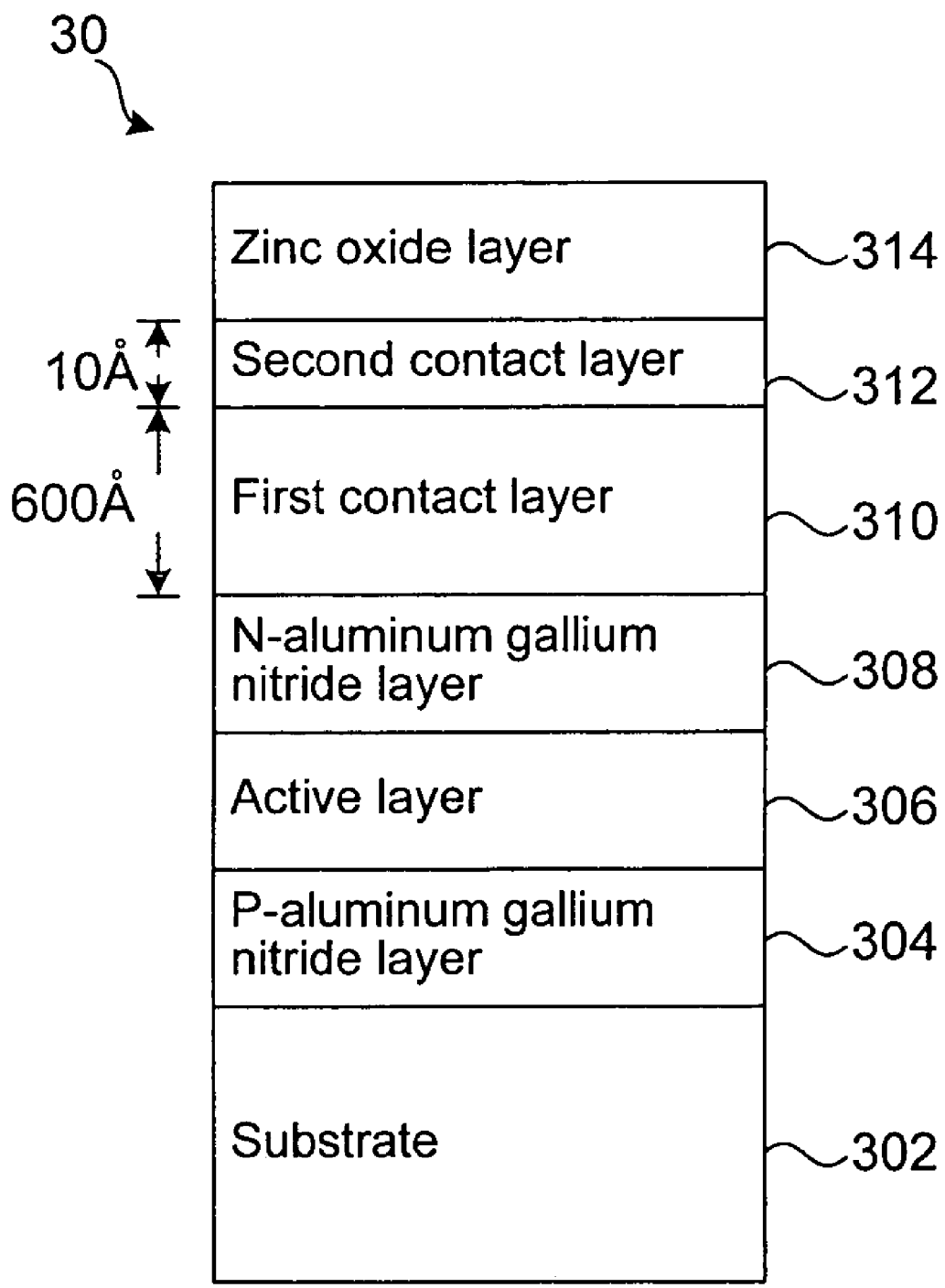
FIG. 3 is still another embodiment of the high luminance LED in accordance with the present invention.

FIG. 3 is a further embodiment of high luminance LED in accordance with the present invention. Referring to FIG. 3, the high luminance LED 30 includes a substrate 302, a P-type aluminum gallium nitride layer 304, an active layer 306, an N-type aluminum gallium nitride layer 308, a first contact layer 310, a second contact layer 312, and a zinc oxide layer 314. The first contact layer 310 has a first bandgap and a first doping concentration. The second contact layer 312 has a second bandgap and a second doping concentration. The first contact layer 310 and the second contact layer 312 include indium gallium aluminum nitride, which has a composition of $In_xGa_yAl_zN$, wherein $x+y+z=1$ and $0 \leq x,y,z \leq 1$. The first bandgap of the first contact layer 310 is smaller than the second bandgap of the second contact layer 312. The first doping concentration and the second doping concentration are respectively larger than a predetermined concentration, which is $5*10^{16} cm^{-3}$ in this embodiment. The first contact layer 310 has a thickness of 600 angstroms. The second contact layer 312 has a thickness of 10 angstroms. The present invention can keep the operating voltage of the LED 30 in an appropriate range by controlling the thickness of the second contact layer 312 within a predetermined thickness. Other characteristics and advantages of this embodiment are similar to the previous description and are not elaborated here for conciseness.

The present invention also discloses a method for fabricating an indium gallium aluminum nitride LED. The method first starts with providing a substrate. A first conductive type nitride layer is formed on the substrate as a cladding material. An active layer is formed on the first conductive type nitride layer as a luminance material. A second conductive type nitride layer is formed on the active layer as a cladding material. A first indium gallium aluminum nitride (InGaAlN) layer is formed on the second conductive type nitride layer, and the first InGaAlN layer has a first bandgap and a first doping concentration. A second InGaAlN layer is formed on the first InGaAlN layer, and the second InGaAlN layer has a second bandgap and a second doping concentration. The first bandgap is smaller than the second bandgap, and the first doping concentration and the second doping concentration are respectively larger than a predetermined concentration. A conductive transparent layer is formed on the second InGaAlN layer. The second InGaAlN layer is thinner than a predetermined thickness and a tunneling effect occurs between the conductive transparent layer and the second InGaAlN layer while the LED is in operation.

The above detailed descriptions of the preferred embodiments provide a clear understanding of the present invention. The present invention provides a high luminance LED, which includes a contact layer with low doping concentration, and operates at a low and stable forward voltage. However, the embodiments are not intended to limit the scope of the invention. Contrarily, various modifications of the illustrative embodiments, as well as other embodiments of the invention, will be apparent to persons skilled in the art upon reference to this description. It is therefore contemplated that the appended claims will cover any such modifications or embodiments as falling within the true scope of the invention.

What is claimed is:

1. A light emitting diode (LED), comprising:
a substrate;
a first conductive type nitride layer disposed on the substrate as a cladding material;
an active layer disposed on the first conductive type nitride layer as a luminance material;
a second conductive type nitride layer disposed on the active layer as a cladding material;
a first contact layer disposed on the second conductive type nitride layer, the first contact layer having a first bandgap;
a second contact layer disposed on the first contact layer, the second contact layer having a second bandgap, wherein the first bandgap is smaller than the second bandgap; and
a conductive transparent layer disposed on the second contact layer;
wherein the second contact layer is smaller than a predetermined thickness and a tunneling effect is occurred between the conductive transparent layer and the second contact layer while the LED is in operation.

2. The light emitting diode of claim 1, wherein the first contact layer has a first doping concentration; and the second contact layer has a second doping concentration; and wherein the first doping concentration and the second doping concentration are respectively larger than a predetermined concentration.

3. The light emitting diode of claim 2, wherein the predetermined concentration is $5*10^{16} cm^{-3}$.

4. The light emitting diode of claim 1, wherein the predetermined thickness is 20 Angstroms.

5. The light emitting diode of claim 1, wherein the first contact layer includes indium gallium aluminum nitride.

6. The light emitting diode of claim 5, wherein the composition of the first contact layer is $In_xGa_yAl_zN$, wherein $x+y+z=1$ and $0 \leq x,y,z \leq 1$.

7. The light emitting diode of claim 1, wherein the second contact layer includes indium gallium aluminum nitride.

8. The light emitting diode of claim 7, wherein the composition of the second contact layer is $In_xGa_yAl_zN$, wherein $x+y+z=1$ and $0 \leq x,y,z \leq 1$.

9. The light emitting diode of claim 1, wherein the conductive transparent layer includes indium tin oxide, zinc oxide, indium oxide, zirconium oxide, and the likes.

10. A light emitting diode, comprising:
a substrate;
first conductive type nitride layer disposed on the substrate as a cladding material;
an active layer disposed on the first conductive type nitride layer as a luminance material;
a second conductive type nitride layer disposed on the active layer as a cladding material;
a first indium gallium aluminum nitride (InGaAlN) layer disposed on the second conductive type nitride layer, the first InGaAlN layer having a first bandgap and a first doping concentration, the composition of the first InGaAlN layer being $In_xGa_yAl_zN$, wherein $x+y+z=1$ and $0 \leq x,y,z \leq 1$;

a second InGaAlN layer disposed on the first InGaAlN layer, the second InGaAlN layer having a second bandgap and a second doping concentration, wherein the first bandgap is smaller than the second bandgap, and the first doping concentration and The second doping concentration are respectively larger than a predetermined concentration; and a conductive transparent layer disposed on the second InGaAlN layer;

wherein the second InGaAlN layer is smaller than a predetermined thickness and a tunneling effect is occurred between the conductive transparent layer and the second InGaAlN layer while the LED is in operation.

11. The light emitting diode of claim 10, wherein the predetermined concentration is $5*10^{16} cm^{-3}$.

12. The light emitting diode of claim 10, wherein the predetermined thickness is 20 Angstroms.

13. The light emitting diode of claim 10, wherein the composition of the second InGaAlN layer is $In_xGa_yAl_zN$, wherein $x+y+z=1$ and $0 \leq x,y,z \leq 1$.

14. The light emitting diode of claim 10, wherein the conductive transparent layer includes indium tin oxide, zinc oxide, indium oxide, zirconium oxide, and the likes.

15. A method for fabricating an indium gallium aluminum nitride LED, comprising:

providing a substrate;

forming a first conductive type nitride layer on the substrate as a cladding material;

forming an active layer on the first conductive type nitride layer as a luminance material;

forming a second conductive type nitride layer on the active layer as a cladding material;

forming a first indium gallium aluminum nitride (InGaAlN) layer on the second conductive type nitride layer, the first InGaAlN layer having a first bandgap and a first doping concentration;

forming a second InGaAlN layer on the first InGaAlN layer, the second InGaAlN layer having a second bandgap and a second doping concentration, wherein the first bandgap is smaller than the second bandgap, and the first doping concentration and the second doping concentration are respectively larger than a predetermined concentration; and forming a conductive transparent layer on the second InGaAlN layer;

wherein the second InGaAlN layer is smaller than a predetermined thickness and a tunneling effect is occurred between the conductive transparent layer and the second InGaAlN layer while the LED is in operation, and wherein the composition of the second InGaAlN layer is $In_xGa_yAl_zN$, wherein $x+y+z=1$ and $0 \leq x,y,z \leq 1$.

16. The light emitting diode of claim 15, wherein the predetermined concentration is $5*10^{16} cm^{-3}$.

17. The light emitting diode of claim 15, wherein the predetermined thickness is 20 Angstroms.

18. The light emitting diode of claim 15, wherein the composition of the first InGaAlN layer is $In_xGa_yAl_zN$, wherein $x+y+z=1$ and $0 \leq x,y,z \leq 1$.

* * * * *